(12) United States Patent
Madurawe

(10) Patent No.: US 7,042,756 B2
(45) Date of Patent: May 9, 2006

(54) CONFIGURABLE STORAGE DEVICE

(75) Inventor: Raminda Udaya Madurawe, Sunnyvale, CA (US)

(73) Assignee: Viciciv Technology, Sunnyvale, CA (US)

(*) Notice: Subject to any disclaimer, the term of this patent is extended or adjusted under 35 U.S.C. 154(b) by 160 days.

(21) Appl. No.: 10/683,084

(22) Filed: Oct. 14, 2003

(65) Prior Publication Data
US 2004/0080999 A1    Apr. 29, 2004

Related U.S. Application Data

(60) Provisional application No. 60/419,208, filed on Oct. 18, 2002.

(51) Int. Cl.
*G11C 11/00* (2006.01)

(52) U.S. Cl. .................. 365/154; 365/189.08; 327/202
(58) Field of Classification Search ................ 365/154, 365/189.08; 327/202
See application file for complete search history.

(56) References Cited

U.S. PATENT DOCUMENTS

| | | | |
|---|---|---|---|
| 4,424,581 A * | 1/1984 | Kawai ........................ 365/154 |
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,343,406 A | 8/1994 | Freeman et al. |
| 5,416,362 A * | 5/1995 | Byers et al. ................. 327/202 |
| 5,488,316 A | 1/1996 | Freeman et al. |
| 5,684,744 A | 11/1997 | Orgill et al. |
| 5,844,422 A | 12/1998 | Trimberger et al. |
| 6,061,417 A | 5/2000 | Kelem |
| 6,097,211 A | 8/2000 | Couts-Martin et al. |
| 6,134,173 A | 10/2000 | Cliff et al. |
| 6,275,065 B1 | 8/2001 | Mendel |
| 6,331,784 B1 | 12/2001 | Mason et al. |
| 6,420,925 B1 | 7/2002 | Fifield et al. |
| 6,448,808 B1 | 9/2002 | Young et al. |

OTHER PUBLICATIONS

Seals & Whapshott, "Programmable Logic—PLDs and FPGAs", 1997, pp. 102-117, McGraw-Hill, USA.
Ashok K. Sharma, "Programmable Logic Handbook—PLDs, CPLDs, & FPGAs", 1998, pp. 99-171, McGraw-Hill, USA.

* cited by examiner

*Primary Examiner*—Huan Hoang

(57) ABSTRACT

An inexpensive, re-configurable storage device for programmable and application specific logic is disclosed. A configurable storage device comprising a storage circuit including at least one output and at least one input capable of changing said output in a well defined response sequence; and a configuration circuit including at least one memory element to control a portion of said storage circuit; and a programmable means of altering said storage circuit response sequence. This allows the user greater flexibility in picking the most desired flip-flop from a variety of choices. The user programmed flip-flop option converts to an application specific conductive pattern with no change in storage device performance.

18 Claims, 8 Drawing Sheets

| Flip flop type | S0 | S1 | S2 | S3 | S4 |
|---|---|---|---|---|---|
| S/R | 0 | 1 | 1 | 0 | 0 |
| J/K | 0 | 1 | 1 | 1 | 0 |
| T | 1 | 1 | 0 | 1 | 0 |
| D | 1 | 0 | 1 | 0 | 1 |
| S/R Clocked | 1 | 1 | 1 | 0 | 0 |
| J/K Clocked | 1 | 1 | 1 | 1 | 0 |

Table-1

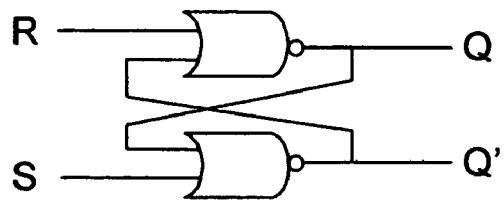
Fig-1A
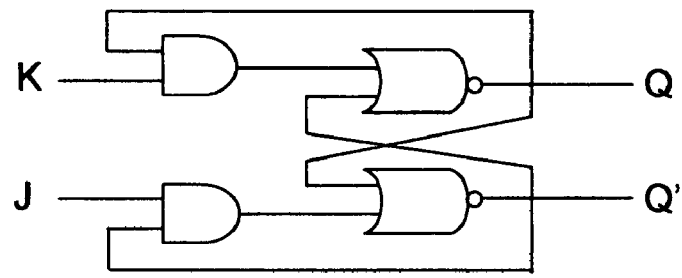
Fig-1B
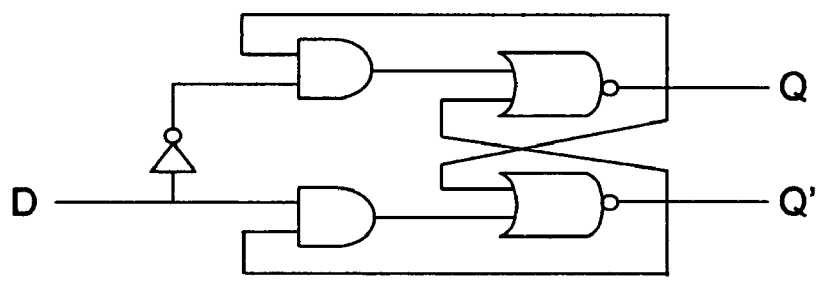
Fig-1C
| Flip-Flop | Next State Characteristic Equation |
|---|---|
| SR | Q+ = S + R' * Q |
| JK | Q+ = J * Q' + K' * Q |
| D | Q+ = D |
Fig-2A

| S | R | Q | Q+ | J | K | Q | Q+ |
|---|---|---|----|---|---|---|----|
| 0 | 0 | 0 | 0  | 0 | 0 | 0 | 0  |
| 0 | 0 | 1 | 1  | 0 | 0 | 1 | 1  |
| 0 | 1 | 0 | 0  | 0 | 1 | 0 | 0  |
| 0 | 1 | 1 | 0  | 0 | 1 | 1 | 0  |
| 1 | 0 | 0 | 1  | 1 | 0 | 0 | 1  |
| 1 | 0 | 1 | 1  | 1 | 0 | 1 | 1  |
| 1 | 1 | 0 | NA | 1 | 1 | 0 | 1  |
| 1 | 1 | 1 | NA | 1 | 1 | 1 | 0  |
Fig-2B
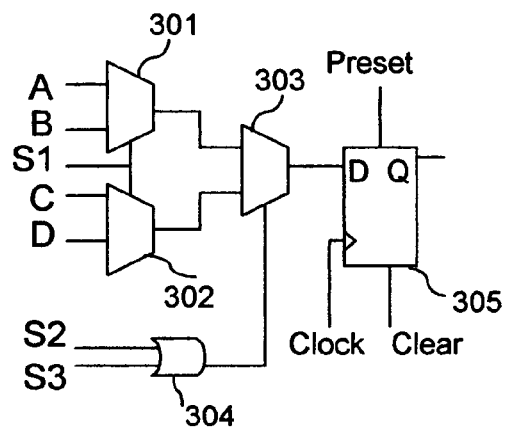
Fig-3
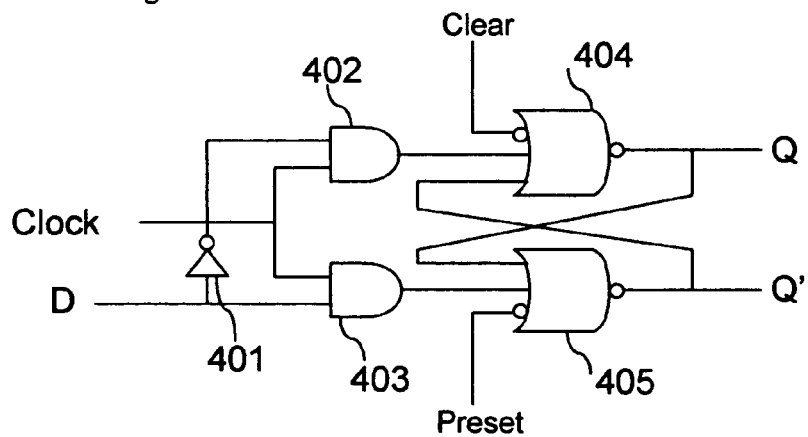
Fig-4

| Flip flop type | S0 | S1 | S2 | S3 | S4 |
|---|---|---|---|---|---|
| S/R | 0 | 1 | 1 | 0 | 0 |
| J/K | 0 | 1 | 1 | 1 | 0 |
| T | 1 | 1 | 0 | 1 | 0 |
| D | 1 | 0 | 1 | 0 | 1 |
| S/R Clocked | 1 | 1 | 1 | 0 | 0 |
| J/K Clocked | 1 | 1 | 1 | 1 | 0 |

Table-1

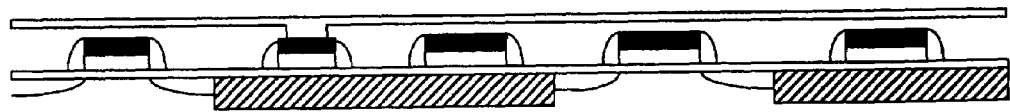
Fig - 15.1
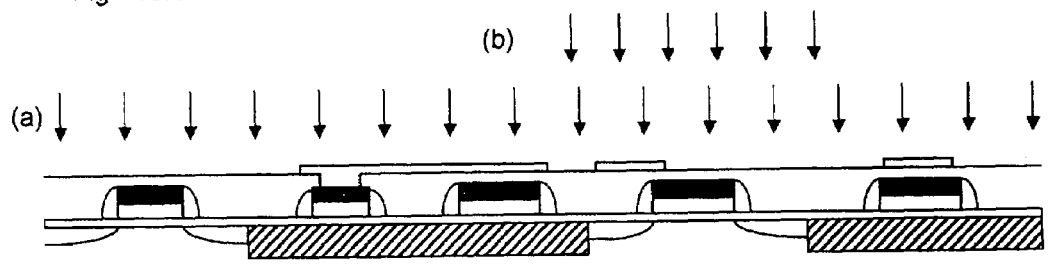
Fig - 15.2
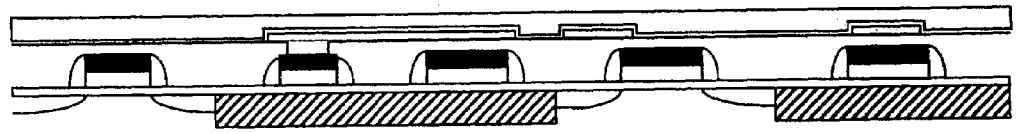
Fig - 15.3
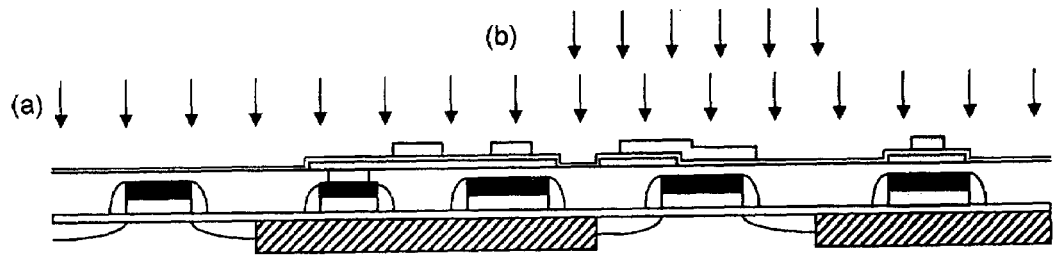
Fig - 15.4

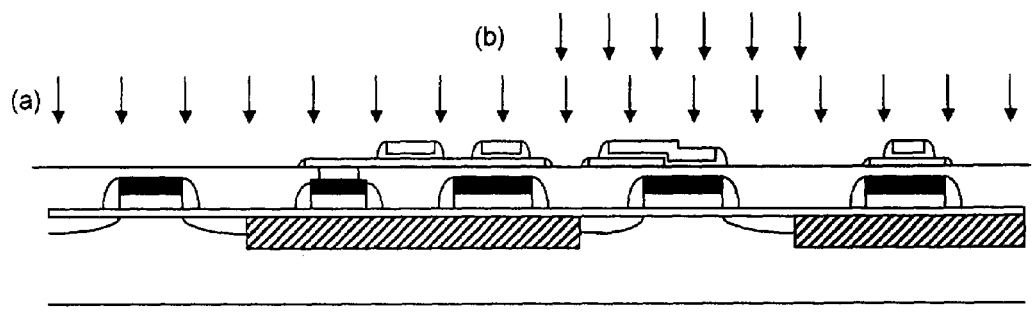
Fig - 15.5
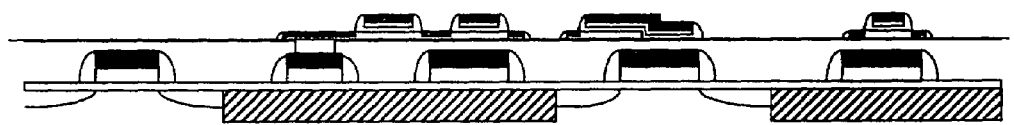
Fig - 15.6
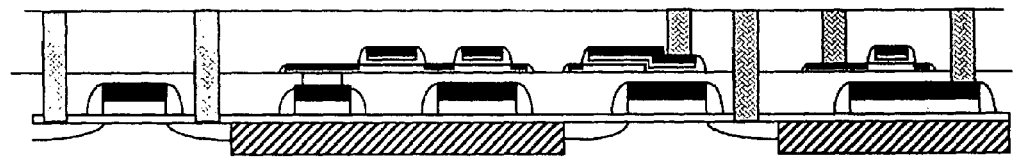
Fig - 15.7

CONFIGURABLE STORAGE DEVICE

This application claims priority from Provisional Application Ser. No. 60/419,208 entitled "Programmable multi-purpose flip-flop" filed on Oct. 18, 2002 which has as inventor Mr. R. U. Madurawe and the contents of which are incorporated herein by reference.

BACKGROUND

The present invention relates to reconfigurable semiconductor storage devices.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. In the event of finding a logic error in the custom or semi-custom IC during final test phase, the design and fabrication cycle has to be repeated. Such lengthy correction cycles further aggravate the time to market and engineering cost. As a result, ASICs serve only specific applications and are custom built for high volume and low cost applications.

Another type of semi custom device called a Gate Array customizes modular blocks at a reduced NRE cost by synthesizing the design using a software model similar to the ASIC. The missing silicon level design verification results in multiple spins and lengthy design iterations.

In recent years there has been a move away from custom or semi-custom ICs towards field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional approaches. Compared to PLD and FPGA, an ASIC has hard-wired logic connections, identified during the chip design phase. ASIC has no multiple logic choices and no configuration memory to customize logic. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage). The cost of Silicon real estate for programmability provided by the PLD and FPGA compared to ASIC determines the extra cost the user has to bear for customer re-configurability of logic functions.

Multi-input and multi-output digital logic systems are classified into combinational and sequential logic. Combinational logic has no memory and the outputs reflect a function solely of present inputs. Sequential logic is implemented by inserting memory into the logic path. This allows present input states as well as past input and past output states to determine the present output. In sequential logic the logic output and logic inputs can be stored and re-used as inputs at a later time point. Many such logic systems include clocks, preset and clear signals and are classified into synchronous and asynchronous systems. A storage element is used to store information about the previous condition of the sequential logic system. The most common bistable circuit in use is a multivibrator, or commonly called flip-flop. In a sequential circuit, these flip-flops can be by passed to facilitate combinational logic. Flip-flops contain two inverting gates cross-coupled in a positive feed back to assume one of two stable output states. There are many types of flip-flops available for use: SR, JK, Clocked JK, T, D with and without Preset and Clear options. They provide a pair of complementary outputs and contain one or more inputs that can cause the output state to change. FIG. 1 shows a schematic diagram of three basic flip-plops: SR in FIG. 1A, JK in FIG. 1B and D in FIG. 1C. The complementary outputs are customarily labeled Q and Q' (not Q). The inputs are labeled S, R, J, K or D in each of the respective flip-flops. The user application determines the best option for the flip-flop in the logic design.

A flip-flop has a present state and a next state. The present state means the state of Q output in FIG. 1 at the time input signals are applied or changed. The next state means the state of Q output after the flip-flop has reacted to the inputs signals. The transient time taken for the flip-flop to stabilize is carefully avoided in the logic design. Each flip-flop has a well defined sequence for its output behavior in response to input signals. This next state sequence differs from one flip-flop to another and can be characterized by a Characteristic Equation, State Graph, Truth Table, and Karnaugh Map. Examples of characteristic equations and truth tables for some of the flip-flops in FIG. 1 are shown in FIG. 2. As shown in FIG. 2, the undesired states in SR flip-flop are removed in the JK flip-flop, while the D flip-flop has only a single input and an output reflecting that input.

A master-slave flip-flop is a structure where input and output terminals are kept disjoint. A common arrangement is to cascade two flip-flops and clock data in complementary signals. The master flip-flop captures data from inputs on one phase of the clock, while the slave flip-flop captures data from the master flip-flop in the opposite phase of the clock.

Existing PLD and FPGA architectures utilizing flip-flops are discussed in Hartmann U.S. Pat. No. 4,609,986, Carter U.S. Pat. No. 4,706,216, Turner et al. U.S. Pat. No. 4,761,768, Norman et al. U.S. Pat. No. 4,864,161, Freemann U.S. Pat. No. 4,870,302, ElGamal et al. U.S. Pat. No. 4,873,459, Freemann et al. U.S. Pat. Nos. 5,488,316 & 5,343,406, Trimberger et al. U.S. Pat. No. 5,844,422, Cliff et al. U.S. Pat. No. 6,134,173, Couts-Martin et al. U.S. Pat. No. 6,097,211, Mendel U.S. Pat. No. 6,275,065 and Young et al. U.S. Pat. No. 6,448,808. These have flip-flops embedded in basic the logic elements of an FPGA fabric or the macro-cells of a PLD fabric. FPGA's and PLD's are constructed with a repetitive pattern consisting of these basic building blocks. A routing block is programmed to define inputs and outputs to the logic blocks, while the logic block performs a specific logic function. Such a logic block described in Ref-1 is shown in FIG. 3, which has a built in fixed D-flip-flop. In FIG. 3, elements 301, 302 and 303 are 2:1 MUX's controlled by one input signal. Element 304 is an OR gate while 305 is a D-Flip-Flop. Eight inputs feed the logic block. All two-input, most 3-input and some 4-input variable functions are realized in the logic block and latched to the D-Flip-Flop. The Flip-Flop in itself offers no configurable capability. Most FPGA's and PLD's referenced earlier have a similar built-in D Flip-Flop inside the logic block. An AND, NOR gate realization of a clocked D-Flip-Flop with Preset and Clear functions is shown in FIG. 4. In FIG. 4, element 401 is an inverter, 402 and 403 are 2-input AND gates and 404 and 405 are 3-input NOR gates. This can be customized by the user only with the logic content available in that and neighboring logic elements. Overall logic capacity is thus reduced from configuring flip-flops outside of what is provided by the manufacturer and the available logic density for the application is drastically reduced.

Kaplinsky U.S. Pat. No. 5,164,612, Orgill et al. U.S. Pat. No. 5,684,744, Kelem U.S. Pat. No. 6,061,417 and Fifield et al. U.S. Pat. No. 6,420,925 have discussed programmability with respect to latches, registers and flip-flops. These implementations are either very high in Silicon area, or provide little flexibility for user change. A useful measure of a programmable circuit is the gate comparison to an equivalent specific application circuit. In most programmable devices, after the user has finalized the logic design, it is rarely or never changed. For these designs, a conversion from programmable to application specific is highly desirable. The referenced usages do not lend to an easy economical conversion. An inexpensive, single configurable storage device that will allow the user the flexibility in picking the most desired flip-flop type from a variety of choices is highly desirable for programmable logic applications. Such a design should also lend to an easy application specific design conversion to the user, preserving the original timing characteristics of the circuit during the conversion.

SUMMARY

In one aspect, a configurable storage device comprising: a storage circuit including at least one output and at least one input capable of changing said output in a well defined response sequence; and a configuration circuit including at least one memory element to control a portion of said storage circuit; and a programmable means of altering said storage circuit response sequence.

Implementations of the above aspect may include one or more of the following. A storage device is a bistable circuit. Most common device is a multivibrator, or flip-flop. A flip-flop has two inverting gates cross coupled to provide two stable states. A flip-flop has a pair of complementary outputs. It has one or more inputs that can cause these output state to change. The storage device stores data and has the ability to "remember" past history. Many types of flip-flops are used in IC circuits. Most common types include SR, JK, D, clocked SR, clocked JK and D flip-flops. Flip-flops have a present state and a next state. For each flip-flop type, the output response sequence to input changes are well defined. This well defined response sequence is represented by a characteristic truth table, or a characteristic equation, or Karnaugh map or a next state graph. The storage device comprises a storage circuit consisting of CMOS transistors that include AND, NAND, OR, NOR and pass-gate type logic structures. Configurable means include configuration circuits. Configuration circuits have memory elements and access circuitry to change memory data. Each memory element can be a transistor or a diode or a group of electronic devices. The memory elements can be made of CMOS devices, capacitors, diodes on substrate. The memory elements can be made of thin film devices such as thin film transistors (TFT), capacitors and diodes. The memory element can be selected from the group consisting of volatile or non volatile memory elements. The memory element can also be selected from the group of fuses, antifuses, SRAM cells, DRAM cells, optical cells, metal optional links, EPROMs, EEPROMs, flash, magnetic and ferro-electric elements. One or more redundant memory elements can be provided for controlling the same circuit block. The memory element can generate an output signal to control logic gates. The logic gates can be a pass-gate logic element, AND array, NOR array, a MUX or a Look-Up-Table (LUT). These programmable logic gates may be integrated into flip-flop functionality. Programming these logic via their controlling memory may allow the user programmability to alter the flip-flop response sequence between pre-selected options such as D, SR, JK, T, clocked-SR and clocked-JK. Each response sequence is then well characterized by the memory bit pattern for the programmable gates in the storage circuit.

In a second aspect, A method of forming a configurable storage device comprising: fabricating one or more storage circuits on a substrate; and fabricating a configuration circuit including one or more memory elements substantially above the storage circuits to control a portion of said storage circuits; and fabricating an interconnect layer substantially above said storage circuits and said memory circuits to provide routing to storage circuits and memory circuits.

Implementations of the above aspect may include one or more of the following. Storage circuitry fabrication may adhere to a basic logic process capable of making CMOS transistors. The transistors are formed on P-type substrate, N-type substrate, epi-substrate or SOI substrate wafers. The configuration circuits may be formed above the logic transistors. This may be achieved by inserting a thin-film transistor module at contact layer of the logic process. The thin-film transistor outputs may be directly coupled to CMOS gates on substrate to provide logic control. Buried contacts may be used to make these connections. The contacts may be filled with doped poly-silicon, Titanium-Tungsten, Tungsten Silicide, or some other refractory metal. Memory elements may be constructed also with TFT transistors, capacitors and diodes. The TFT layers may be restricted for only configuration circuits, not used for logic signal lines. Metal layers above the TFT layers may be used for all the routing for the storage device, and configuration device. All signal paths may utilize wires and storage circuitry with no impact from TFT layers used for configuration circuits.

In a third aspect, a method of forming a semiconductor device, comprising: fabricating one or more storage circuits on a substrate; and selectively fabricating either a memory circuit or a conductive pattern substantially above the storage circuits to control a portion of said storage circuits; and fabricating an interconnect and routing layer substantially above the storage circuits and memory circuits to connect storage circuits and one of the memory circuits or the conductive pattern.

Implementations of the above aspect may further include one or more of the following. The memory element can be selected from the group consisting of volatile or non volatile memory elements. The memory can be implemented using a TFT process technology that contains one or more of Fuses, Anti-fuses, DRAM, EPROM, EEPROM, Flash, Ferro-Electric, optical, magnetic and SRAM elements. Configuration circuits may include thin film elements such as diodes, transistors, resistors and capacitor. The process implementation is possible with any memory technology where the programmable element is vertically integrated in a removable module. The configuration circuit includes a predetermined conductive pattern in lieu of memory elements to control the programmable logic in the storage circuits. Multiple memory bits exist to customize logic functions. Each memory bit pattern has a corresponding unique conductive pattern to duplicate the same customized logic function. Circuit performance of the logic function is not affected by the choice of logic control: memory elements or conductive pattern.

Implementations of the above aspects may include one or more of the following. The storage device constitutes fabricating a VLSI IC product. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks.

A series product families can be provided with a modularized programmable element in an FPGA version followed by a turnkey custom ASIC with the same base die with 1–2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

An easy turnkey customization of an ASIC from an original smaller cheaper and faster PLD or FPGA would greatly enhance time to market, performance, and product reliability.

BRIEF DESCRIPTION OF THE DRAWINGS

FIG. 1A shows an exemplary SR flip-flop.
FIG. 1B shows an exemplary JK flip-flop.
FIG. 1C shows an exemplary D flip-flop.
FIG. 2A shows characteristic equations for SR, JK and D type flip-flops.
FIG. 2B shows truth tables for SR and JK type flip-flops.
FIG. 3 shows an exemplary sequential logic element shown in Ref-1.
FIG. 4 shows an exemplary clocked D flip-flop with preset and clear signals.
FIG. 15 shows constructional cross sections of a TFT process.

DESCRIPTION

Figure 5:
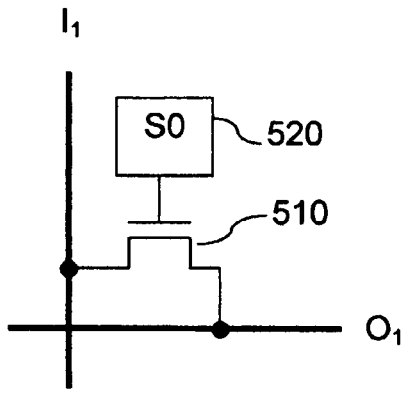
FIG. 5 shows an exemplary programmable pass-gate switch.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate. The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic gate controlled by said memory element. In one embodiment, the configuration circuit includes a plurality of memory circuits to store instructions to configure an FPGA. In another embodiment, the configuration circuit includes a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

A point to point connection can be made utilizing pass-gate logic. FIG. 5 shows exemplary programmable pass-gate logic realization. A transistor 510 connects one input $I_1$ to one output $O_1$. Multiple inputs can be connected to multiple outputs with a plurality of pass-gate logic elements. The transistor 510 can be a PMOS or an NOMS transistor, but NMOS is preferred due to its higher conduction. The gate voltage S0 on NMOS transistor 510 gate electrode determines an ON or OFF connection. That logic level is generated by a configuration circuit 520 coupled to the gate of NMOS transistor 510. The pass-gate logic connection requires the configuration circuitry to generate signal S0 with sufficient voltage levels to ensure off and on conditions. For an NMOS pass-gate, S0 having a logic level one completes the point to point connection, while a logic level zero keeps them disconnected. In addition to using only an NMOS gate, a PMOS gate could also be used in parallel to make the connection. The configuration circuit 520 needs to then provide complementary outputs (S0 and S0') to drive NMOS and PMOS gates making the connection. Configuration circuit 520 contains a memory element. This memory element can be configured by the user to select the polarity of S0, thereby selecting the status of the connection. The memory element can be volatile or non-volatile. In volatile memory, it could be DRAM, SRAM, Optical or any other type of a memory device. In non-volatile memory it could be fuse, anti-fuse, EPROM, EEPROM, Flash, Ferro-Electric, Magnetic or any other kind of memory device. The output S0 can be a direct output coupled to the memory bit, or a derived output from the configuration circuitry. An inerter can be used to restore S0 signal level to achieve full rail to rail voltage levels.

Figure 6A:
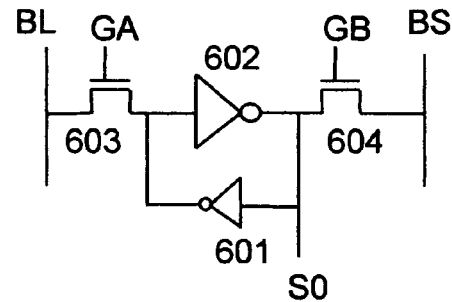
FIG. 6A shows an exemplary SRAM memory based configuration circuit.
Figure 6B:
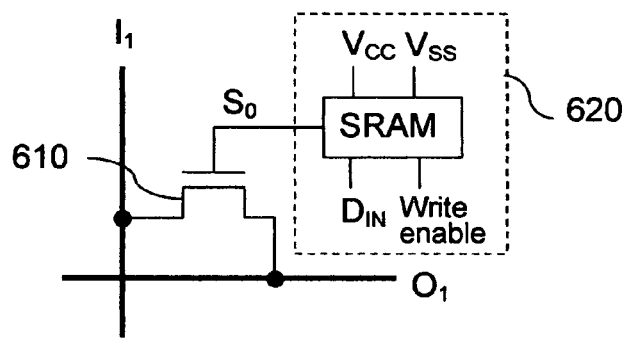
FIG. 6B shows a pass transistor switch with SRAM based configuration circuit.

The memory element in the configuration circuit can be one of any number of possibilities. A few of these possibilities will be discussed next to illustrate the concept of this invention. A volatile six transistor SRAM based configuration circuit is shown in FIG. 6A. The SRAM memory bit can be any one of 6-transistor, full CMOS, R-load or TFT PMOS load to name a few. Two inverters 601 and 602 connected back to back forms the memory element. This memory element is latch. Power and ground terminals for the inverters are not shown in FIG. 6A. Access NMOS transistors 603 and 604, and access wires GA, GB, BL and BS provide the means to configure the memory element. Applying zero and one on BL and BS respectively, and raising GA and GB high enables writing zero into device 603 and one into device 604. The output S0 delivers a logic one. Applying one and zero on BL and BS respectively, and raising GA and GB high enables writing one into device 603 and zero into device 604. The output S0 delivers a logic zero. The SRAM construction may allow applying only a zero signal at BL or BS to write data into the latch. The SRAM latch will hold the data state as long as power is on. When the power is turned off, the SRAM bit needs to be restored to the previous state from an outside permanent memory. In the literature for programmable logic, this second non-volatile memory is also called configuration memory. The SRAM configuration circuit controlling logic pass-gate is illustrated in FIG. 6B. The S0 output directly driven by the memory element in FIG. 6A drives the pass-gate gate electrode. In addition to S0 output and the latch, power, ground, data in and write enable signals in 620 constitutes the SRAM configuration circuit. Write enable circuitry includes GA, GB, BL, BS signals shown in FIG. 6A.

Figure 7:
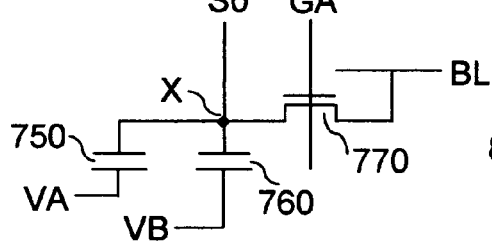
FIG. 7 shows an anti-fuse based memory configuration circuit.

An anti-fuse based configuration circuit is shown next in FIG. 7. Configuration circuit 620 in FIG. 6B can be replaced with the anti-fuse circuit shown in FIG. 7. In FIG. 7, output level S0 is generated from node X which is coupled to signals VA and VB via two anti-fuses 750 and 760 respectively. Node X is connected to a programming access transistor 770 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 770. A high voltage is applied across anti-fuse 750 to pop the oxide and short the terminals. Similarly anti-fuse 760 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power) is applied to the two signal lines. Depending on the blown fuse, signal S0 will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 8:
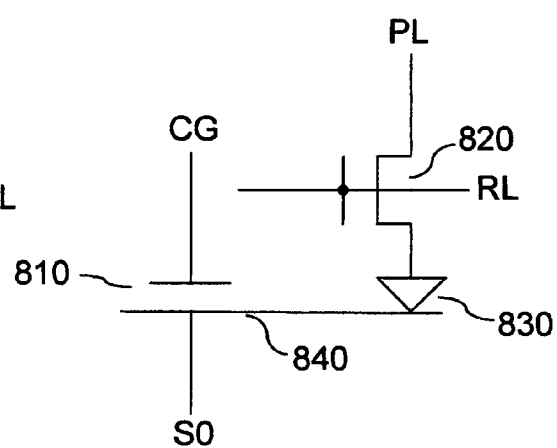
FIG. 8 shows an EEPROM based memory configuration circuit.

FIG. 8 shows an EEPROM non-volatile configuration circuit. Configuration circuit 620 in FIG. 6B can be replaced with the EEPROM circuit shown in FIG. 8. In FIG. 8, node 840 is a floating gate. This is usually a poly-silicon film isolated by an oxide all around. It is coupled to the source end of programming transistor 820 via a tunneling diode 830. The tunneling diode is a thin dielectric capacitor between floating poly and substrate silicon with high doping on either side. When a large programming (or erase) voltage Vpp is applied across the thin dielectric, a Fowler-Nordheim current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erase can be done while the chip is in a system. It is hence called in system programmable. An oxide or dielectric capacitor 810 couples the floating gate (FG) to a control gate (CG). The control gate CG can be a heavily doped silicon substrate plate or a second poly-silicon plate above the floating poly. The dielectric can be oxide, nitride, ONO or any other insulating material. A voltage applied to CG will be capacitively coupled to FG node 840. The coupling ratio is designed such that 60–80 percent of CG voltage will be coupled to FG node 840. To program this memory element, a negative charge must be trapped on the FG 840. This is done by applying Vpp voltage on CG, ground voltage on PL and a sufficient high (Vcc) on RL. CG couples a high positive voltage onto FG 840 creating a high voltage drop across diode 830. Electrons move to the FG 840 to reduce this field. When the memory device is returned to normal voltages, a net negative voltage remains trapped on the FG 840. To erase the memory element, the electrons must be removed from the floating gate. This can be done by UV light, but an electrical method is more easily adapted. The CG is grounded, a vey high voltage (Vpp+more to prevent a threshold voltage drop across 820) is applied to RL, and a very high voltage (Vpp) is applied to PL. Now a low voltage is coupled to FG with a very high positive voltage on the source side of device 820. Diode 830 tunneling removes electrons of FG. This removal continues beyond a charge neutral state for the isolated FG. When the memory device is returned to normal voltages, a net positive voltage remains trapped on the FG 840. Under normal operation RL is grounded to isolate the memory element from the programming path, and PL is grounded. A positive intermediate voltage Vcg is applied to CG terminal. FG voltage is denoted S0. Under CG bias, S0 signal levels are designed to activate pass-gate logic correctly. The circuit block in FIG. 8 can be utilized in configuration circuit 620 in FIG. 6B, and in place of configuration block 520 in FIG. 5 to perform the same function.

Figure 9:
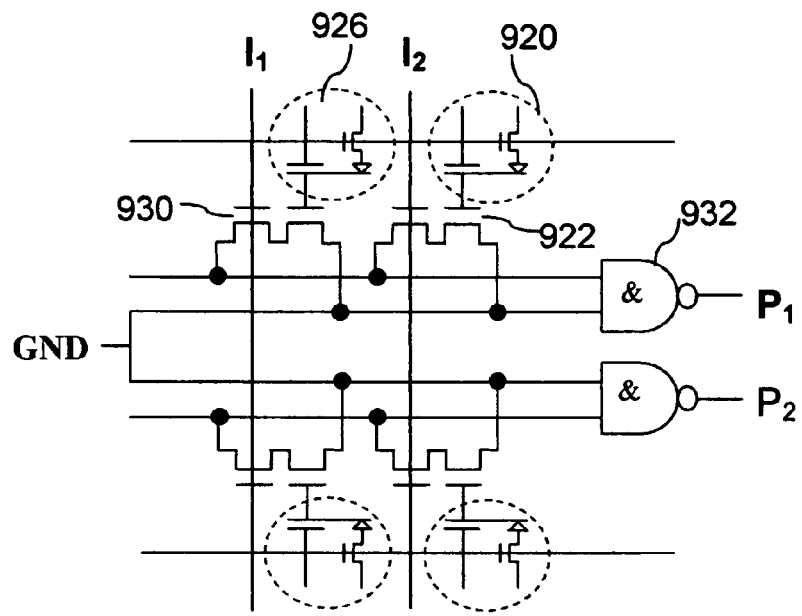
FIG. 9 shows an EEPROM implementation of a P-Term logic array.

These configuration circuits can be used to realize many programmable logic functions. FIG. 9 shows an EEPROM non-volatile memory element in the implementation of a P-Term in NAND-NOR logic. FIG. 9 shows two mirrored outputs P1 and P2. For output P1, an AND gate 932 comprised of a pull-up device receives signals from pass transistors 922, 924, 928 and 930 for the pull-down function. The pass transistor 922 is controlled by block 920 shown in the dashed circle, while the pass transistor 928 is controlled by a similar block 926 shown inside the dashed circle. These blocks 920 and 926 show the configuration circuits shown in FIG. 8. Blocks 920 and 926 can be replaced by any one of configurations shown in FIG. 6A or FIG. 7 to realize this logic function. Pass transistors 922, 924, 928, 930 and the AND gate 932 show the logic block of the PLD. The logic block is not affected by the choice of the configuration circuit. This voltage output level applied to the gate of device 922 is designed to turn the device off or on.

Figure 10A:
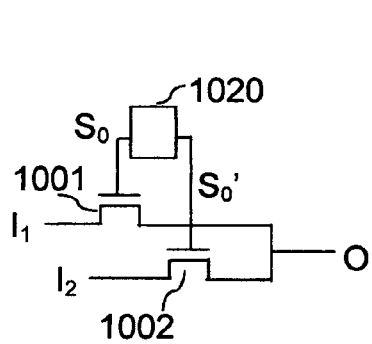
FIG. 10A shows an exemplary 2:1 programmable logic MUX with pass-gate logic.
Figure 10B:
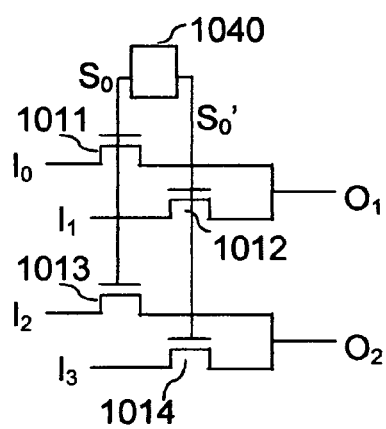
FIG. 10B shows two 2:1 MUX's with one memory bit and pass-gate logic.

Another logic function realized by these configuration circuits is a programmable MUX. FIG. 10A shows a programmable 2:1 MUX, while FIG. 10B shows two 2:1 programmable MUX's. In the MUX in FIG. 10A, two pass-gates 1001 and 1002 allow two inputs I1 and I2 to be connected to output O. A configuration circuit 1020 having two complementary control signal outputs S0 and S0' provides the programmability. When S0=1, S0'=0, I1 is coupled to O. When S0=0, S0'=1, I2 is coupled to O. With one memory element inside 1020, one input is always coupled to the output. If two bits were provided inside 1020, two mutually exclusive outputs S0 and S1 could be generated by 1020. That would allow neither I1 nor I2 to be coupled to O, if such a requirement exists in the logic design. The two MUX's in FIG. 10B operate with a single memory element in configuration circuit 1040. Similar to FIG. 10A, one of I0 and I1 is connected to O1 while one of I2 and I3 is connected to O2. In one memory state I0 and I2 are selected, while in the opposite state I1 and I3 are selected. Both configuration circuits 1020 and 1040 can be any one of circuits shown in FIG. 6A, FIG. 7 or FIG. 8. It could also be a similarly constructed configuration circuit with DRAM, EPROM, Flash, fuse-links, ferro-electric, magnetic, optical or any other memory element.

SRAM memory technology has the advantage of not requiring a high voltage to configure memory. The SRAM based switch shown in FIG. 6B containing the SRAM memory circuit shown in FIG. 6A utilizes 6 extra configuration transistors, discounting the pass-gate 610, to provide the programmability. That is a significant overhead compared to application specific circuits where the point to point connection can be directly made with metal. Similarly other programmable memory elements capable of configuring pass-gate logic also carry a high silicon foot print. A cheaper method of constructing a vertically integrated SRAM cell is described in application Ser. No. 10/413,810 entitled "Semiconductor Latches and SRAM Devices", filed on Apr. 14, 2003 and list as inventor Mr. R. U. Madurawe, the contents of which are incorporated herein by reference. In one embodiment, the configuration circuit is built on thin-film semiconductor layers located vertically above the logic circuits. The SRAM memory element, a thin-film transistor (TFT) CMOS latch, comprises two lower performance back to back inverters formed on two semiconductor thin film layers, substantially different from a first semiconductor single crystal substrate layer and a gate poly layer used for logic transistor construction. This latch is stacked above the logic circuits for slow memory applications with no penalty on Silicon area and cost. This latch is adapted to receive power and ground voltages in addition to configuration signals. The two programming access transistors for the TFT latch are also formed on thin-film layers. Thus in FIG. 6B, all six configuration transistors shown in 620 are constructed in TFT layers, vertically above the pass transistor 610. Transistor 610 is in the conducting path of the connection and needs to be a high performance single crystal Silicon transistor. This vertical integration makes it economically feasible to add an SRAM based configuration circuit at a very small cost overhead to create a programmable solution. Such vertical integration can be extended to all other memory elements that can be vertically integrated above logic circuits.

Figure 11:
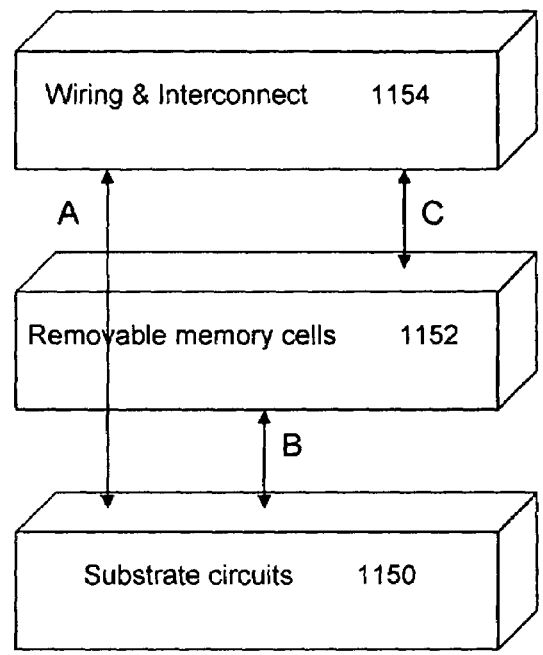
FIG. 11 shows a modular construction of a programmable logic device.

A new kind of a programmable logic device utilizing thin-film transistor configurable circuits is disclosed in application Ser. No. 10/267,484 entitled "Methods for Fabricating Three-Dimensional Integrated Circuits", application Ser. No. 10/267,483 entitled "Three Dimensional Integrated Circuits", and application Ser. No. 10/267,511 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference. The disclosures describe a programmable logic device and an application specific device fabrication from the same base Silicon die. The PLD is fabricated with a programmable memory module, while the ASIC is fabricated with a conductive pattern in lieu of the memory. Both memory module and conductive pattern provide identical control of logic circuits. For each set of memory bit patterns, there is a unique conductive pattern to achieve the same logic functionality. The vertical integration of the configuration circuit leads to a significant cost reduction for the PLD, and the elimination of TFT memory for the ASIC allows an additional cost reduction for the user. FIG. 11 shows an implementation of vertically integrated circuits, where the configuration memory element is SRAM. First, silicon transistors 1150 are deposited on a substrate. A module layer of removable SRAM memory cells 1152 are positioned above the silicon transistors 1150, and a module layer of interconnect wiring or routing circuit 1154 is formed above the removable memory cells 1152. To allow this replacement, the design adheres to a hierarchical layout structure. As shown in FIG. 11, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most layer satisfying the same device and routing constraints. This description is equally applicable to any other configuration memory element, and not limited to SRAM cells.

Fabrication of the IC also follows a modularized device formation. Formation of transistors 1150 and routing 1154 is by utilizing a standard logic process flow used in the ASIC fabrication. Extra processing steps used for memory element 1152 formation are inserted into the logic flow after circuit layer 1150 is constructed. A full disclosure of the vertical integration of the TFT module using extra masks and extra processing is in the incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the incorporated by reference applications discussed above.

Figure 12A:
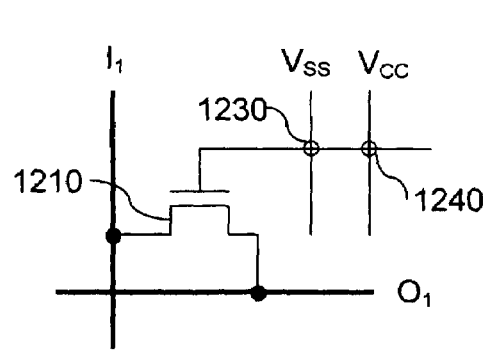
FIG. 12A shows a conductive pattern for a pass-gate switch.
Figure 12B:
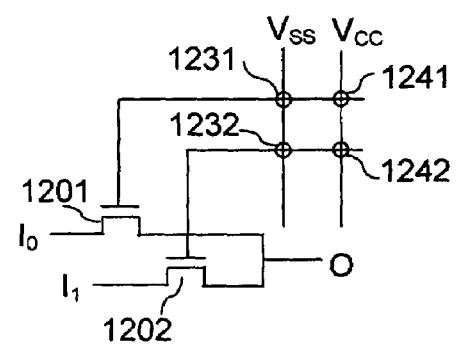
FIG. 12B shows a conductive pattern for a 2:1 pass-gate MUX.

The ASIC migration of the point to point connection in FIG. 6B and the 2:1 MUX in FIG. 10A are illustrated in FIG. 12A and FIG. 12B respectively. In FIG. 12A, the gate input signal to pass-gate 1210 has two possible conductive pattern connections: connection 1230 to Vss and connection 1240 to Vcc. The connections are made in metal or contacts between metal in the data base. Based on the S0 output state being 0 or 1 of a memory pattern to map into a conductive pattern, either Vss or the Vcc connection is chosen. For each memory bit state, only one conductive pattern connection is made. Similarly in FIG. 12B, pass-gate 1201 has conductive pattern options to Vss and Vcc at nodes 1231 and 1241 respectively. Pass-gate 1202 has conductive pattern options to Vss and Vcc at nodes 1232 and 1242 respectively. One of I0 or I1 can be connected to O from this option. Comparing FIG. 6A with FIG. 12A and FIG. 10A with FIG. 12A, the point to point connection is identical between the two configuration options: memory element and conductive pattern. The signal delay through these pass-gate connections also remains identical, independent of the control option.

In a second embodiment for the conductive pattern, the pass-gate 1210 drain is shorted to source in FIG. 12A by a metal wire when S0=1. Wire resistance is reduced by eliminating pass-gate 1210 ON resistance from the signal path. When S0=0, the pass-gate is left connected to Vss. The signal delay will be altered between the conducting pattern and memory options. That change can be emulated in the FPGA by raising only memory Vcc, raising S0 voltage to reduce 1210 ON resistance. This may be desirable to users who need higher performance in the ASIC and ensure no other timing violations.

In FIG. 11, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed in the second plane to store instructions to control a portion of the circuit blocks.

As the discussions demonstrate, memory controlled pass transistor logic elements provide a powerful tool to make switches. The ensuing high cost of memory can be drastically reduced by the 3-dimensional integration of configuration elements and the replaceable modularity concept for said memory. These advances allow designing a storage element containing a generic flip-flop that can be configured by the user to any type without utilizing additional Logic Elements. For example a generic flip-flop may be configured by the user to be D, SR, JK, clocked SR, clocked JK, or T type.

Figure 13:
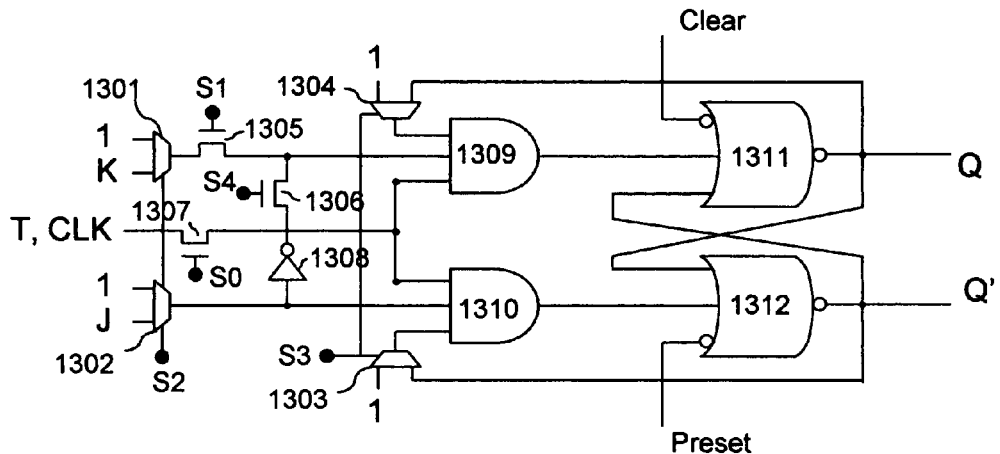
FIG. 13 shows one embodiments of a configurable storage device.

One embodiment of a new programmable multi function flip-flop is shown in FIG. 13. The multi-purpose flip-flop is designed with a storage circuit to perform the flip-flop function and a configuration circuit for the user to program one flip-flop from a variety of available options. In FIG. 13, the configuration circuit include five (S0, S1, S2, S3, S4) memory elements to configure the flip-flop to SR, JK, clocked SR, Clocked JK, D and T flip-flop. The configurable flip-flop discussed in U.S. Pat. No. 5,684,744 has no memory elements. In FIG. 13, the configuration circuit can be any one of the previously shown options as in FIG. 6A, FIG. 7 and FIG. 8. Any other memory element adapted to providing the functionality described under those sections can also be used in this flip-flop design. The control signal levels (denoted S0 for the circuit in FIG. 6A) from said five bits in FIG. 13 are also denoted S0, S1, S2, S3 and S4 in this discussion. Table-1 describes the programmable means of altering the flip-flop type by configuring the memory bits. The bubbles in FIG. 9 represent any number of possible configuration circuits. Such possible options include circuits discussed in FIG. 7 and FIG. 8. A preferred option is the 6T-SRAM cell based configuration circuit as shown in FIGS. 6A and 6B. Elements 1301, 1302, 1303 and 1304 are 2:1 MUXs as shown in FIG. 10A. These MUXs are grouped in pairs 1301, 1302 and pair 1303, 1304 and constructed as shown in FIG. 10B to function with only one memory element for both MUX's. As marked in FIG. 13, one input in the 2:1 MUX is at logic 1 or at voltage Vcc. Element 1308 is a CMOS inverter capable of inverting the J-input shown. Elements 1309 and 1310 are 3-input AND gates. Elements 1311 and 1312 are 3-input NOR gates. They are all assumed to be full-CMOS for this discussion. The two NOR gates are cross-coupled to provided a positive feed-back. Elements 1305, 1306 and 1307 are NMOS pass-gate logic transistors. There are 6 more NMOS pass-gate logic transistors embedded in the four 2:1 MUXs 1301, 1302, 1303 and 1304. Storage device has two complementary outputs Q and Q'. The feed-back in the NOR gates ensure data stability. The inputs have multiple options and are labeled J (=S), K (=R), D, T, CLK, Preset and Clear. Preset and Clear signals are active low. They need to be asserted to logic zero to activate logic. One of Preset=0 or Clear=0 signals sets flip-flop Q=1 or Q=0 respectively for all flip-flop types. The clock (CLK) is active high. Configuration circuit outputs S0, S1, S2, S3 and S4 at logic "1" or logic "0" govern the conditions of the pass-gates. The NMOS pass gate is "on" or "off" when the logic output is "1" or "0" respectively. There are 11 NMOS pass-gates controlled by 5 memory elements in the configuration circuit to configure this generic flip-flop.

In FIG. 13, the S0 bit controls the T input, or Clock input signal. When S0=1, the T input goes through to AND gates 1309 and 1310 to enable clocking. When S0=0 the T or Clock input is disabled. This input is selected by the user for a T flip flop or as the Clock input for clocked flip flops. Row-3 in Tab-1 shows other bit configuration to activate a T flip-flop. J and K inputs to AND gates are disabled by setting S0=0 and selecting logic 1. The inverter is disabled by S4 bit. Q and Q' feedbacks are provided to AND gates 1309 and 1310 respectively with S3 bit. When the T-input is low, AND gates 1309 and 1310 are forced to output logic-0, which provide don't care input states for the NOR gates. Clear and Preset also inputs logic-0 to the NOR gates when not asserted. When T-input goes high, Q will flip from its original state creating a toggle response to the T-input.

In FIG. 13, the S1 bit allows K input to get to input AND gate 1309. When S1=1 the K input is selected to AND gate 1309. When S1=0 the K input is disconnected. The S2 bit selects either J and K inputs or logic-1 inputs. When S2=1, the input MUX's 1301 and 1302 select J and K as inputs, while when S1=0, the input MUX's 1301 and 1302 select logic-1 as the inputs. Similarly S3 bit controls the Q and Q' (not Q) feed-backs in MUX's 1304 and 1303 respectively. The feed-back is disabled by setting S3=0. The MUX 1303 and 1304 outputs feed into to AND gates 1310 and 1309 respectively. S3=0 selects logic-1 that act as don't care inputs to AND gates. S3=1 allows the Q and Q' feed backs to AND gate inputs. The bit S4 allows conversion to D flip-flop. When S4=1, J (now equal to D) is fed to AND gate 1310, while K-input is disabled by S1, and inverted J input is fed to AND gate 1309.

As shown in Tab-1, all flip-flop types can be realized by configuring the 5 memory bits. The user does not have to use extra logic from adjacent logic blocks to configure the flip-flop, allowing a wide degree of user flexibility in logic design. The D-flip flop shown in FIG. 4 has 22 transistors. Discounting SRAM configuration circuit transistors, the multi-purpose flip-flop in FIG. 13 has 37 transistors. All 37 transistors belong to the storage circuit. Additional 15 transistors are 2 extra PMOS transistors (in 3-input AND gates), and 13 extra NMOS transistors (8 in the 2:1 MUX's, 3 in NMOS pass-gates and 2 in the 3-input AND gates). The layout area can be kept under 1.5× of the area of D-flip flop in FIG. 4 due to compact NMOS layout rules in spite of 1.7× increase in transistor count. In addition to the 37 gates, FIG. 13 also has 5 extra 6T-SRAM elements taking up 30 extra transistors for configuration circuit. This programmable multi-purpose flip-flop would have taken 67 extra transistors on a non stackable SRAM process technology, making the 3× Si cost prohibitive for any practical application. Under the new techniques disclosed in this invention, those 30 extra configuration transistors in a 3D integration occupy the same area as the 37 storage transistors of the multi-purpose flip-flop, causing no additional area and cost penalty.

NMOS pass-gate logic realization has two disadvantages. Passing Vcc (logic 1) is degraded due to threshold voltage drop across the NMOS. As a result, the input AND gates do not receive full Vcc signal level which may cause slightly higher power consumption. This can be overcome with CMOS pass-gates or by running the TFT SRAM Vcc level in FIG. 6B higher than the logic Vcc level by an amount equal to the body-effect adjusted threshold voltage of logic NMOS transistor. This allows logic NMOS gate in FIG. 13 to pass full Vcc, improving both performance and power consumption.

Figure 14:
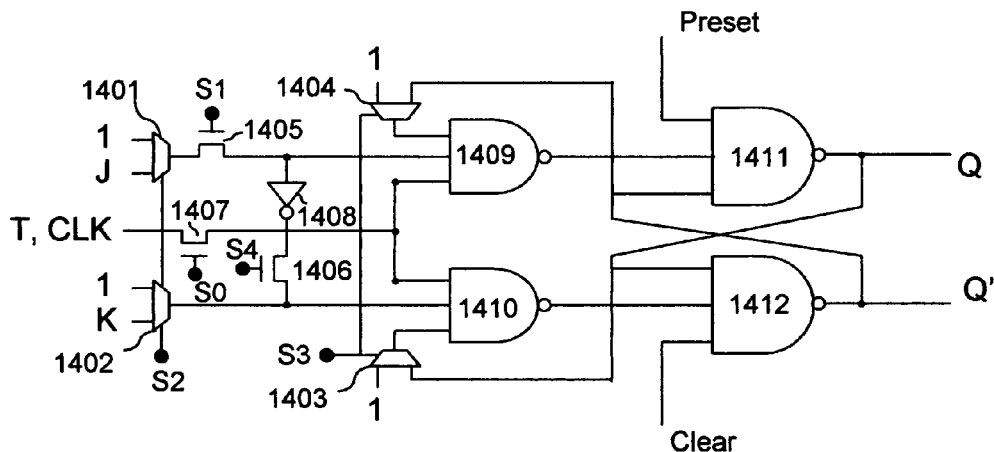
FIG. 14 shows a second embodiment of a configurable storage device.
Table-1 shows the bit pattern to customize generic flip-flops shown in FIG. 13 and FIG. 14.

FIG. 14 illustrates a second embodiment of a multi purpose generic flip-flop. In FIG. 14, elements 1409, 1410, 1411 and 1412 are all 3-input NAND gates. Preset and Clear are active low asynchronous signals to set and reset the flip-flop independent of the clock signal. Clock (T or CLK) is an active high signal. All popular flip-flops can be derived from this generic flip-flop by programming the bit-pattern as shown in Table-1. The configuration circuits and memory elements to realize this flip-flop can be any one of the possible circuits described in the body of this discussion.

Both flip-flops shown in FIG. 13 and FIG. 14 has a unique bit pattern for the chosen flip-flop type. That bit pattern identifies output levels S0, S1, S2, S3 and S4 needed for configuration. Those levels can be mapped to a conductive pattern as shown in FIGS. 12A and 12B. Once the user identifies the flip-flop of choice in the programmable logic application, the same flip-flop can be mapped to the application specific application using this conductive pattern.

The fabrication of thin-film transistors to fabricate configuration circuits is discussed next. A full discussion is provided in application Ser. No. 10/413,809 entitled "Semi-conductor Switching Devices", filed on Apr. 14, 2003, which lists as inventor Mr. R. U. Madurawe, the contents of which are incorporated herein by reference.

The following terms used herein are acronyms associated with certain manufacturing processes. The acronyms and their abbreviations are as follows:

| | |
|---|---|
| $V_T$ | Threshold voltage |
| LDN | Lightly doped NMOS drain |
| LDP | Lightly doped PMOS drain |
| LDD | Lightly doped drain |
| RTA | Rapid thermal annealing |
| Ni | Nickel |
| Ti | Titanium |
| TiN | Titanium-Nitride |
| W | Tungsten |
| S | Source |
| D | Drain |
| G | Gate |
| ILD | Inter layer dielectric |
| C1 | Contact-1 |
| M1 | Metal-1 |
| P1 | Poly-1 |
| P− | Positive light dopant (Boron species, $BF_2$) |
| N− | Negative light dopant (Phosphorous, Arsenic) |
| P+ | Positive high dopant (Boron species, $BF_2$) |
| N+ | Negative high dopant (Phosphorous, Arsenic) |
| Gox | Gate oxide |

-continued

| | |
|---|---|
| C2 | Contact-2 |
| LPCVD | Low pressure chemical vapor deposition |
| CVD | Chemical vapor deposition |
| ONO | Oxide-nitride-oxide |
| LTO | Low temperature oxide |

A logic process is used to fabricate CMOS devices on a substrate layer for the fabrication of storage circuits. These CMOS devices may be used to build AND gates, OR gates, inverters, adders, multipliers, memory and pass-gate based logic functions in an integrated circuit. A CMOSFET TFT module layer or a Complementary gated FET (CGated-FET) TFT module layer may be inserted to a logic process at a first contact mask to build a second set of TFT MOSFET or Gated-FET devices. Configuration circuitry is build with these second set of transistors. An exemplary logic process may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field
Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+ mask and PMOS P+ G, S, D implant
Ni deposition
RTA anneal—Ni salicidation (S/D/G regions & interconnect)
Unreacted Ni etch
ILD oxide deposition & CMP FIG. 15 shows an exemplary process for fabricating a thin film MOSFET latch in a module layer. In one embodiment the process in FIG. 15 forms the latch in a layer substantially above the substrate layer. The processing sequence in FIGS. 15.1 through 15.7 describes the physical construction of a MOSFET device for storage circuits shown in FIG. 13, and FIG. 14. The process of FIG. 15 includes adding one or more following steps to the logic process after ILD oxide CMP step.

C1 mask & etch
W-Silicide plug fill & CMP
~300 A poly P1 (crystalline poly-1) deposition
P1 mask & etch
Blanket Vtn P-implant (NMOS Vt)
Vtp mask & N-implant (PMOS Vt)
TFT Gox (70 A PECVD) deposition
500 A P2 (crystalline poly-2) deposition
P2 mask & etch
Blanket LDN NMOS N-tip implant
LDP mask and PMOS P-tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly re-crystallization (G/S/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-silicon transistors. In the embodiment in FIG. 15, the module insertion is after the substrate device gate poly etch and the ILD film is deposition. In other embodiments the insertion point may be after M1 and the ILD is deposition, prior to V1 mask, or between two metal definition steps.

After gate poly of regular transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module.

Then, a first P1 poly layer, amorphous or crystalline, is deposited by LPCVD to a desired thickness as shown in FIG. 15.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P-doping, while the PMOS transistor regions are mask selected and implanted with N-doping. This is shown in FIG. 15.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P-implant followed by masked N-implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30–200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300 A to 2000 A thick, preferably 500 A is deposited as amorphous or crystalline poly-silicon by LPCVD as shown in FIG. 15.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). The source & drain P1 regions orthogonal to P2 gate regions are now self aligned to P2 gate edges. The S/D P2 regions may contact P1 via buried contacts. NMOS devices are blanket implanted with LDN N-dopant. Then PMOS devices are mask selected and implanted with LDP P-dopant as shown in FIG. 15.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 15.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 15.6. This 100 A–500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 15.7.

A TFT process sequence similar to that shown in FIG. 15 can be used to build complementary Gated-FET thin film devices. Compared with CMOS devices, these are bulk conducting devices and work on the principles of JFETs. A full discussion of these devices are provided in application Ser. No. 10/413,808 entitled "Insulated-Gate Field-Effect Thin Film Transistors", filed on Apr. 14, 2003 and list as inventor Mr. R. U. Madurawe, the contents of which are incorporated herein by reference. The process steps facilitate the device doping differences between MOSFET and Gated-FET devices, and simultaneous formation of complementary Gated-FET TFT devices. A detailed description for this process was provided when describing FIG. 15 earlier and is not repeated. An exemplary CGated-FET process sequence may use one or more of the following steps:

C1 mask & etch
W-Silicide plug fill & CMP
~300 A poly P1 (crystalline poly-1) deposition
P1 mask & etch
Blanket Vtn N-implant (Gated-NFET $V_T$)
Vtp mask & P-implant (Gated-PFET $V_T$)
TFT Gox (70 A PECVD) deposition
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A configurable storage device comprising:
   a storage circuit including at least one output and at least one input capable of changing said output in a well defined response sequence; and
   a configuration circuit including at least one memory element to control a portion of said storage circuit, wherein the memory element is located above said storage circuit; and
   a programmable means of altering said storage circuit response sequence.

2. The device of claim 1, wherein the storage device is a flip-flop.

3. The device of claim-i, wherein the response sequence is comprised of at least two Characteristic Truth Tables from the set S-R, Clocked S-R, D, T, J-K and Clocked J-K flip-flops.

4. The device of claim 1, wherein the storage device is a master-slave flip-flop.

5. The device of claim 4, wherein the response sequence is comprised of at least two Characteristic Truth Tables from the set S-R, Clocked S-R, D, T, J-K and Clocked J-K flip-flops.

6. The device of claim 1, wherein said memory element is comprised one of volatile and non volatile memory element.

7. The device of claim 1, wherein said memory element is comprised one of a diode, transistor, thin film device, thin film resistor, thin film capacitor and a thin film transistor.

8. The device of claim 1, wherein the memory element is selected from one of fuse links, anti-fuse capacitors, SRAM cells, DRAM cells, metal optional links, EPROM cells, EEPROM cells, flash cells, ferro-electric elements, optical elements and magnetic elements.

9. The device of claim 1 further comprising:
a programmable pass-gate in said storage circuit; and
a control signal to turn said pass-gate on or off generated by said memory element and coupled to said pass-gate; and
a configuration access to change data in said memory element to provide said programmable means.

10. The device of claim 1, wherein said response sequence is comprised of a behavior represented by one of a next state Truth Table, next state Graph, next state Characteristic Equation, and a next state Karnaugh Map.

11. The device of claim 1 further comprising:
a plurality of memory elements in said configuration circuit; and
a plurality of programmable pass-gates in said storage circuit; and
a plurality of control signals to turn said pass-gates on or off generated by said memory elements and coupled to said pass-gates; and
a configuration access to change data in said memory elements to provide said programmable means; and
a plurality of memory bit data sets, each set uniquely programming said storage device to perform one well defined response sequence.

12. A configurable storage device comprising:
one or more storage circuits fabricated on a substrate; and
a configuration circuit including one or more memory elements fabricated substantially above the storage circuits to control a portion of said storage circuits; and
an interconnect layer fabricated substantially above said storage circuits to provide routing to storage circuits and memory circuits;
wherein, the storage circuit response sequence is alterable by the data in the memory elements.

13. The device of claim 12 further comprising:
one or more programmable pass-gates fabricated on said substrate; and
one or more configuration access transistors and memory transistors fabricated on thin-film layers substantially above said substrate; and
a control signal generated by said memory element coupled to gate electrode of said pass-gate; and
a programmable means to change said memory data via said access transistors.

14. A semiconductor storage device, comprising:
one or more storage circuits fabricated on a substrate; and
selectively fabricating either a memory circuit or a conductive pattern substantially above the storage circuits to control a portion of said storage circuits; and
an interconnect and routing layer fabricated substantially above the storage circuits to connect storage circuits and one of the memory circuits or the conductive pattern;
wherein, the storage circuit response sequence is alterable by the data in the memory circuit option; and
wherein, one specific response sequence is customized by said conductive pattern option.

15. The device of claim 14, wherein the storage circuits contain programmable pass-gates.

16. The device of claim 15, wherein memory circuit contains programmable memory to configure pass-gates.

17. The device of claim 15, wherein conductive pattern contains hard wired controls to configure pass-gates.

18. The device of claim 14, wherein a given configuration of the memory circuit and the corresponding conductive pattern have one or more substantially matching storage circuit performance characteristics.

* * * * *